United States Patent [19]
Itoh et al.

[11] Patent Number: 5,247,480
[45] Date of Patent: Sep. 21, 1993

[54] ELECTRICALLY ERASABLE PROGAMMABLE READ-ONLY MEMORY WITH NAND CELL BLOCKS

[75] Inventors: Yasuo Itoh, Kawasaki; Masaki Momodomi, Yokohama; Yoshihisa Iwata, Yokohama; Tomoharu Tanaka, Yokohama; Fujio Masuoka, Yokohama, all of Japan

[73] Assignee: Kabushiki Kaisha Toshiba, Kawasaki, Japan

[21] Appl. No.: 773,723

[22] Filed: Oct. 9, 1991

Related U.S. Application Data

[63] Continuation of Ser. No. 516,311, Apr. 30, 1990, Pat. No. 5,075,890.

[30] Foreign Application Priority Data

May 2, 1989 [JP] Japan .................. 1-113315

[51] Int. Cl.$^5$ .............................. G11C 11/40
[52] U.S. Cl. .................. 365/189.09; 365/189.11; 365/185; 365/104
[58] Field of Search ........... 365/104, 184, 185, 189.09, 365/189.11, 211

[56] References Cited

U.S. PATENT DOCUMENTS

| | | | |
|---|---|---|---|
| 4,233,526 | 11/1980 | Kurugi et al. | 365/184 |
| 4,677,590 | 6/1987 | Arakawa | 365/185 |
| 4,694,314 | 9/1987 | Teruda et al. | 365/185 |
| 4,805,150 | 2/1989 | Asano et al. | 365/230.06 |
| 4,939,690 | 7/1990 | Momodomi et al. | 365/185 |
| 4,959,812 | 9/1990 | Momodomi et al. | 365/185 |
| 4,980,861 | 12/1990 | Herdt et al. | 365/104 X |
| 5,075,890 | 12/1991 | Itoh et al. | 365/104 |

FOREIGN PATENT DOCUMENTS

0134390 10/1981 Japan .................. 365/189.05

OTHER PUBLICATIONS

IEEE International Solid-State Circuits Conference, 16, Feb. 1989, Digest of Technical Paper, S. 134, 135.

*Primary Examiner*—Joseph A. Popek
*Attorney, Agent, or Firm*—Oblon, Spivak, McClelland, Maier & Neustadt

[57] ABSTRACT

An electrically erasable programmable read-only memory has memory cell blocks, each of which has NAND type cell units associated with the bit lines respectively. Each cell unit has a series-circuit of floating gate type memory cell transistors and a selection transistor provided between the corresponding bit line and the series-circuit of memory cell transistors. A row decoder is provided in common to the memory cell blocks, for generating an "H" level voltage which is supplied to a selection gate control line connected to the selection transistor and to a selected word line or lines in a cell unit. A voltage boost circuit is provided for every memory cell block, for causing the "H" level voltage to increase up to a preselected potential level which is high enough to render the cell transistors conductive. The voltage boost circuit includes a first booster section for the selection gate control line, and a second section for the word lines. The second section operates in response to the output voltage of the first section.

11 Claims, 7 Drawing Sheets

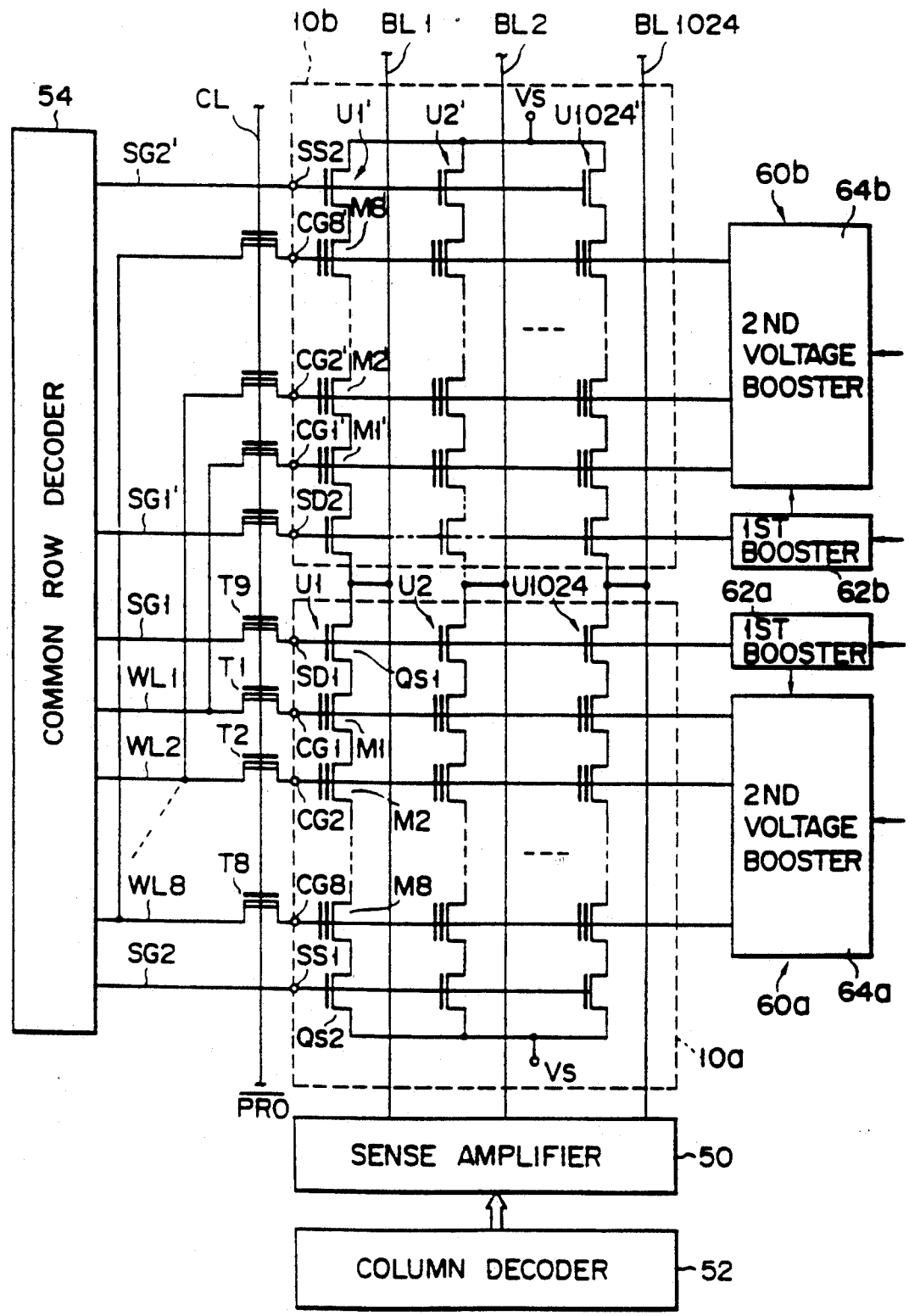
F I G. 1

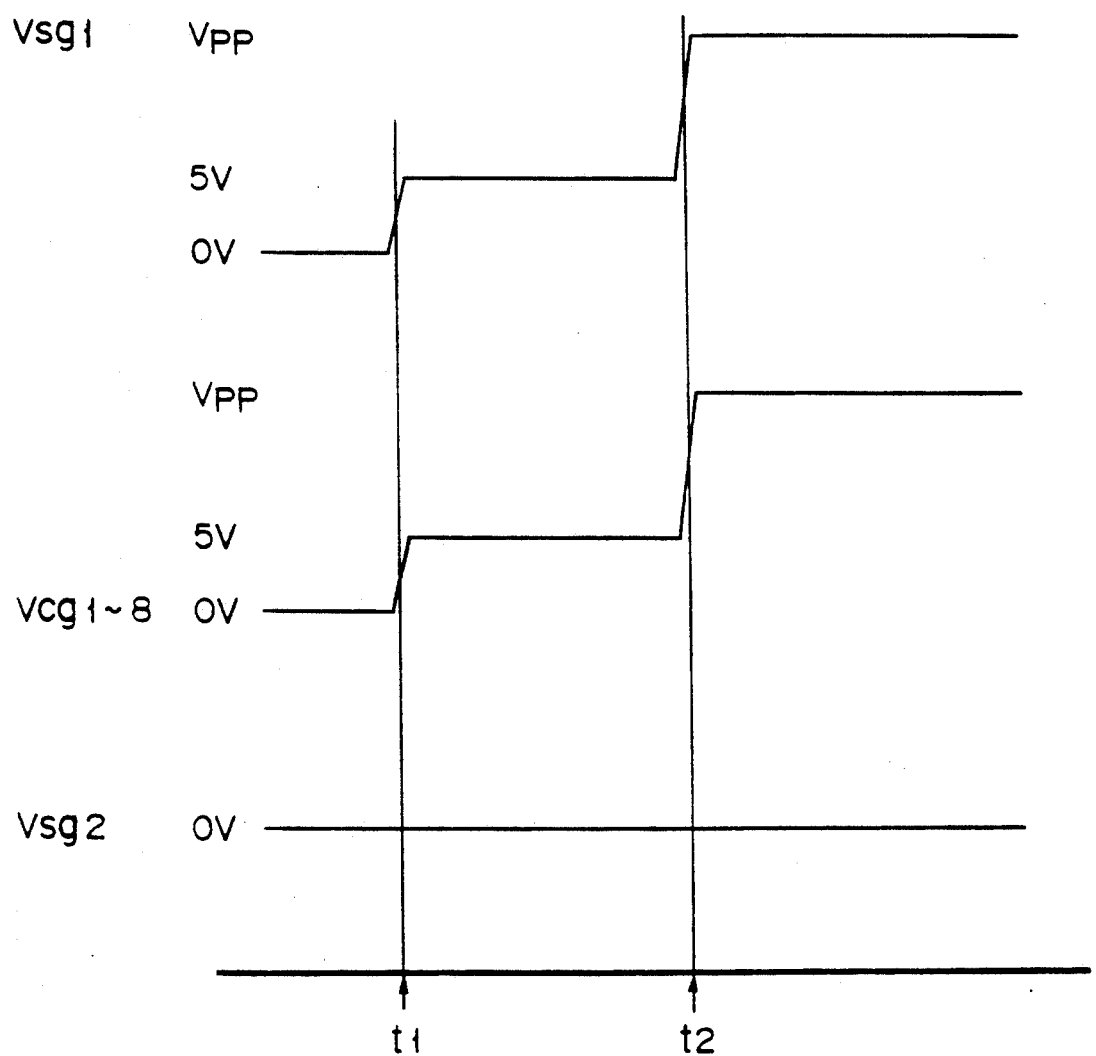
F I G. 6

ELECTRICALLY ERASABLE PROGAMMABLE READ-ONLY MEMORY WITH NAND CELL BLOCKS

This is a continuation of application Ser. No. 07/516,311, filed on Apr. 30, 1990, now U.S. Pat. No. 5,075,890.

BACKGROUND OF THE INVENTION

Field of the Invention

The present invention relates to semiconductor memories and, in more particular, to non-volatile semiconductor memories having NAND type memory cell blocks which are programmable and which may be electrically erased.

Description of the Related Art

With the increasing needs for high performance and reliability of digital computer systems, the technique for highly integrated memory cells becomes indispensable. A solid-state memory with enhanced data storage capacity has been demanded strongly, which can replace existing external data storage devices for digital computer systems, such as a magnetic floppy diskette drive unit, a fixed disk unit, or the like.

A presently available electrically erasable programmable read-only memory (to be referred to as an "EEPROM" hereinafter) has technical advantages, such as superior in reliability and higher in data programming rate than the magnetic data storage devices are; however, the total memory amount of the EEPROM is still not so large as to replace the magnetic data storage devices. In the EEPROM, since each of the memory cells is generally constituted by two transistors, it cannot be expected that the integration density increases so as to be high sufficient to enable the EEPROM to have a required amount of memory that permits the EEPROM to substitute for the known magnetic data storage devices.

Recently, a "NAND" type EEPROM has been developed as one of non-volatile semiconductor memories with enhanced data storage capacity. According to the memory of this type, memory cells are grouped into a preselected number of memory cell block sections, each of which includes a plurality of arrays of memory cells, what are called "NAND" cell arrays, or "NAND" cell units. Every one of the memory cells constituting the "NAND" cell unit typically consists of only one transistor of floating gate type, so that only one contact portion is required between every array of memory cells and the corresponding bit line associated therewith. The occupied area of the overall memory cell section on the substrate can thus be reduced to be much smaller than that of a conventional EEPROM, whereby the integration density of the EEPROM can be improved, with the result in the total memory amount being increased.

With the NAND type EEPROM, however, it has been still under development to optimize the circuit configuration of a peripheral drive circuit for NAND cells, which includes row/column decoder circuits and voltage-generation circuits for generating boosted voltages to control data write, erase, and read operations in the NAND memory cell blocks. According to the presently available NAND type EEPROMs, it should be required that each of the memory cell blocks is provided with a peripheral drive circuit having a row decoder associated therewith. This results in that the peripheral circuits occupy much degree of surface area on the substrate of limited size. Increasing in the occupation area of peripheral drive circuits on the substrate acts as a serious bar to efficient use of chip surface area for the memory cell blocks; therefore, it cannot be expected in the NAND type EEPROMs that the total amount of memory is increased as required.

SUMMARY OF THE INVENTION

It is therefore an object of the present invention to provide a new and improved non-volatile semiconductor memory device with enhanced data storing capability.

It is another object of the invention to provide a new and improved non-volatile semiconductor memory device which can minimize the occupied area of a peripheral circuit section on a substrate thereof to maximize the effective area of memory cell section on the substrate, thereby bringing enhanced data storage capacity.

In accordance with the above objects, the present invention is addressed to a specific erasable programmable read-only memory comprising parallel data transmission lines formed above a chip substrate, and a preselected number of memory cell sections connected to the data transmission lines. These memory cell sections include a first memory cell section and a second memory cell section adjacent to the first section. Each memory cell section comprises a plurality of NAND type cell units, each of which has a series-circuit of a preselected number of data storage transistors and a switching transistor. The data storage transistors have charge storage layers and control gates respectively. Decoder unit is connected in common to the first and second memory cell sections, for generating a first voltage which represents a "high" level. A voltage controller is connected to each of the first and second memory cell sections, for generating, in response to the first voltage, a second voltage having an increased voltage potential high enough to render the switching transistor and the data storage transistors.

The present invention and its objects and advantages will become more apparent in a detailed description of a preferred embodiment to be presented hereinafter.

BRIEF DESCRIPTION OF THE DRAWINGS

In the detailed description of a preferred embodiment of the present invention presented below, reference is made to the accompanying drawings in which:

FIG. 1 is a diagram showing the main part of a circuit arrangement of an electrically erasable programmable read-only memory (EEPROM) in accordance with a preferred embodiment of the present invention;

FIG. 6 is a diagram showing the waveforms of the voltage signals which are generated on the main gate control lines of the EEPROM to demonstrate that some of the voltage signals change with time to have an increased voltage potential.

DETAILED DESCRIPTION OF THE PREFERRED EMBODIMENT

Figure 2:
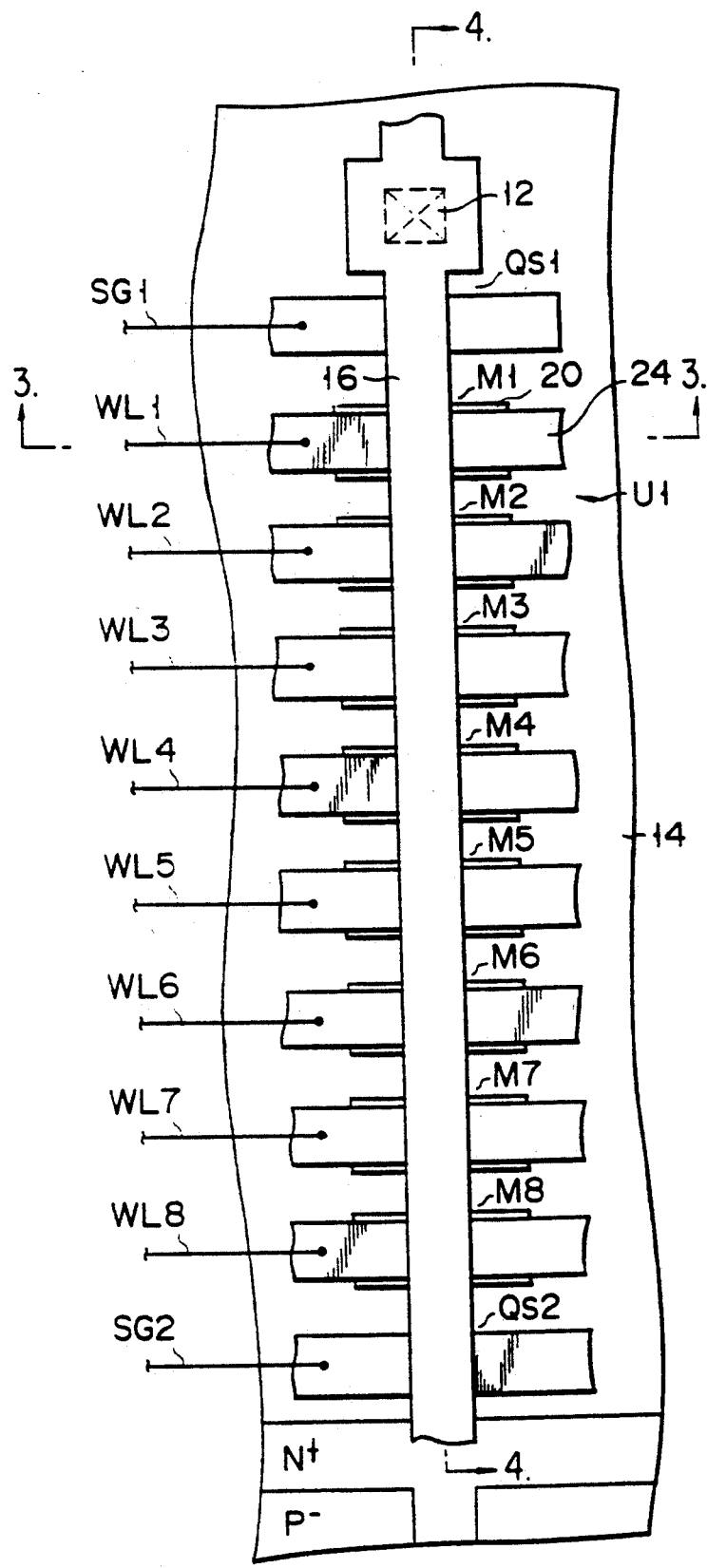
FIG. 2 is a diagram showing a plan view of a "NAND cell unit" provided in the EEPROM shown in FIG. 1 to have a preselected number of memory cell transistors connected in series with one another to constitute the NAND cell unit together with a couple of selection transistors.

Referring now to FIG. 1, an electrically erasable programmable read-only memory (EEPROM) according to a preferred embodiment of the present invention has a plurality of memory cell block sections 10, which are formed on a chip substrate (to be explained later). Memory cell block sections 10 are associated with a preselected number of parallel bit lines BL1, BL2, ..., BLm (reference symbol "BLi" is used to denote an arbitrary one of the bit lines hereinafter) insulatively formed above the substrate. In FIG. 1, only two neighboring cell block sections 10a and 10b are shown for the sake of illustrative simplicity only.

A detailed explanation of the cell block arrangement will be given with respect to only a certain memory cell block section 10a; the remaining cell blocks 10b, ... have essentially the same arrangements, so that the explanation therefor will be omitted for the sake of elimination of redundant descriptions in the present specification.

Memory cell block section 10a, which may be referred to as a "memory cell block" or a "cell block," includes memory cells M arranged in a planar matrix of rows and columns. Each cell of the EEPROM consists of a single transistor. These memory cell transistors M are grouped into a predetermined number of subarrays U1, U2, ..., U1024 which are associated with bit lines BL1, BL2,..., BL1024, respectively. Those of memory cells M included in each subarray Ui are connected in series with one another thereby to constitute a "NAND cell" structure. The subarrays U will be called "NAND cell units" or simply "NAND cells" U1, U2, ..., U1024 hereinafter.

Each of NAND cell unit Ui has two selection transistors Qs1 and Qs2, which are provided at the both ends of the series-circuit of memory cell transistors M. Each of selection transistors Qs may be a metal oxide semiconductor field effect transistor (MOSFET); each memory cell Mi may be a floating gate tunneling metal oxide semiconductor field effect transistor (FATMOS) having a floating gate and a control gate. In this embodiment, one cell block section 10a has 1,024 NAND cell units U1, U2, ..., U1024, each of which includes 8 memory cell transistors M1, M2, ..., M8, as shown in FIG. 1, although such numbers may be changed in accordance with technical requirements in the actual devices.

A series array of transistors of each NAND cell unit Ui is connected at its one end (i.e., the drain of the memory cell transistor M1) to corresponding bit line BLi via first selection transistor Qs1, and is grounded at the other end thereof (i.e., the source of memory cell transistor M8) to substrate voltage Vs through second selection transistor Qs2. NAND cell unit Ui may be electrically connected with the corresponding bit line BLi when first selection transistor Qs1 is rendered conductive; NAND cell unit Ui may be disconnected from it when first selection transistor Qs1 is rendered nonconductive. When second selection transistor Qs2 is rendered conductive, NAND cell unit Ui may be grounded at the source of eighth cell transistor M8.

Parallel word lines WL1, WL2, ..., WL8 are insulatively formed above the substrate so as to cross or intersect with bit lines BL. These word lines may be called "control gate lines CG" within cell block section 10a. Selection transistors Qs and memory cell transistors M are connected to cross points of bit lines BL and word lines WL as shown in FIG. 1, respectively, thereby to constitute a cell matrix. It is noted that lines SG1 and SG2 connected to selection transistors Qs1 and Qs of each cell unit Ui, respectively, are sometimes called "selection gate control lines" in this description.

As shown in FIG. 2, one NAND cell unit, e.g., "U1", has contact hole 12 on lightly-doped P type silicon chip substrate 14. More specifically, contact hole 12 is formed in wiring line layer 16 which insulatively extends above a series array of transistors Qs and M. Wiring line layer 1 overlaps the gates of transistors Qs and M included in cell unit U1 so that it serves as a bit line BL1 associated with NAND cell unit U1. Wiring layer 16 may be an aluminum layer of typically 1 micrometer width.

Figure 3:
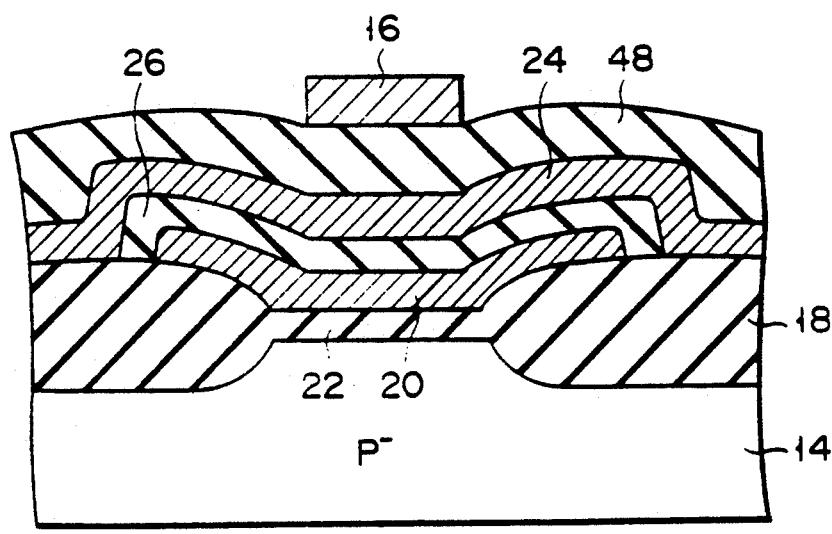
FIG. 3 is a diagram showing a cross-sectional arrangement of the NAND cell unit shown in FIG. 2 taken along line III—III thereof.
Figure 4:
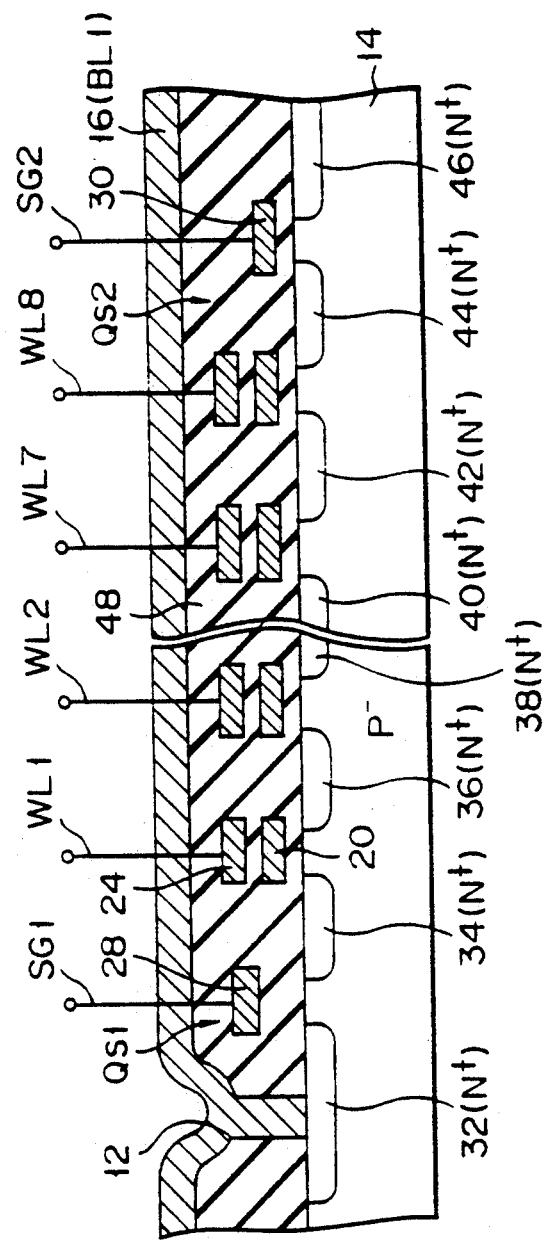
FIG. 4 is a diagram showing a cross-sectional arrangement of the NAND cell unit shown in FIG. 2 taken along line IV—IV thereof.

Referring to sectional views of FIGS. 3 and 4, the transistor array of NAND cell unit U1 is formed on a surface of substrate 14 which is surrounded by insulative layer 18 serving as an element-isolation layer. As is most clearly shown in FIG. 3, MOSFET M1 constituting one memory cell (the remaining memory cells have the same arrangement) has first polycrystalline silicon layer 20 insulatively disposed above substrate 14 by thermal oxide insulative layer 22 of typically 11 nanometers thickness, and second polycrystalline silicon layer 24 insulatively disposed above layer 1 by thermal oxide insulative layer 26 of typically 35 nanometers thickness. Layer 20 serves as an insulated floating gate of MOSFET Mi, whereas layer 24 serves as a control gate of MOSFET Mi. Control gate layer 24 is connected to the corresponding word line (word line W11 in the case of memory cell M1).

As shown in FIG. 3, insulated floating gate 20 expands into the element isolation region, whereby, in each cell Mi, coupling capacitance Cfs between floating gate 20 and substrate 14 is set smaller than coupling capacitance Cfc between floating gate 20 and control gate 24, so that data "programming" (writing/erasing) is enabled by only movement of charge carriers, e.g., electrons in this case, by the "tunneling" effect between floating gate 20 and substrate 14. It is noted in FIG. 2 that floating gate 20 of each memory cell transistor Mi is so illustrated as if it was wider in its width than the overlying control gate 24 in order to provide a more clear presentation only, and that, in an actual device, these gate layers 20 and 24 are self-aligned with each other to have substantially the same width. The gate layers 20 and 24 may be formed to have width of typically 1 micrometer.

As shown in FIG. 4, first selection transistor Qs1 has poly-crystalline silicon layer 28 insulatively disposed above substrate 14. Layer 28 serves as a control gate of selection transistor Qs1. Similarly, second selection transistor Qs2 has polycrystalline silicon layer 30 which is insulatively disposed above substrate 10 so as to serve as a control gate of selection transistor Qs2.

As shown in FIG. 4, heavily-doped N type (N type) diffusion layers 32, 34, 36, 38, ..., 40, 42, 44, and 46 are formed to slightly overlap the gates of transistors Qs and M. These N+ diffusion layers act as sources and drains of the corresponding transistors. For example, layers 32 and 34 serve as the drain and source of selection transistor Qs1; similarly, layers 34 and 36 serve as the drain and source of cell transistor M1.

The above layer structure is entirely covered with CVD insulative layer 48. A through-hole is formed, as shown in FIG. 4, in layer 46 so as to act as contact hole 12 for a series transistor array. Contact hole 12 is located on source diffusion layer 32 of selection transistor Qs1. Aluminum wiring layer 16 lies on insulative layer 46 and is in contact with drain diffusion layer 32 of selection transistor Qs1 by contact hole 12. Layer 16 serves as a bit line associated with the NAND cell unit U1, which may be selectively connected to a data input-/output line.

Referring back to FIG. 1, each of bit lines BLi is connected to sense amplifier circuit 50, which is connected with a column decoder circuit 52. Sense amplifier circuit 50 amplifies a data voltage which appears on a bit line BL1 that is selected by column decoder 52, thereby to detect the logical level, i.e., "0" or "1", of the data in a data readout mode of the EEPROM.

As shown in FIG. 1, word lines WL1 to WL8 are connected to control terminals CG1 to CG8 via switching transistors T1 to T8, respectively. Gate control line SG1 is connected to control terminal SD1 via switching transistor T9. Line SG2 is directly connected to control terminal SS1. Transistors T1 to T9 are connected at their gates to control line CL, to which control signal PRO is supplied. Decoder circuit section 54 is connected to word lines WL and control lines SG at terminals SD1, CG1, CG2, ..., CG8, and SS1. Switching transistors T may be depression type (D type) FETs.

Attention should be paid to the fact that word lines WL are used in common among memory cell block sections 10a, 10b, and so on. More specifically, as clearly shown in FIG. 1, every set of the corresponding word lines WL are connected together to the same signal output of row decoder circuit 54. For example, word line WL1 of memory cell block 10a is connected together with the corresponding control gate terminal CG1' of neighboring memory cell block 10b (and further to other corresponding ones of memory cell blocks 10c, 10d, ... although they are not visible in FIG. 1): this set of word lines are connected to the same output of row decoder 54. This decoder 54 may feed memory cell blocks 10c, 10d, ... associated with the same bit lines BL1 to BL 1024; in this respect, decoder 54 will be referred to as a "common row decoder" hereinafter, in order to emphasize the above "common use" feature of row decoder 54 among memory cell block sections 10.

Voltage boost circuit sections 60 are provided independently for memory cell blocks 10a, 10b, ... More specifically, first cell block 10a is connected with first voltage boost circuit section 60a; second cell bock 10b is connected with second voltage boost circuit section 60b. Each of these voltage boost circuit sections 60a and 60b essentially consists of two voltage boost circuits first voltage boost circuit 62a (62b) for first selection gate control line SG1 to which first selection transistors including selection transistors Qs1 are connected; and second boost circuit 64a (64b) for word lines WL, e.g., control gate terminals CG to which memory cell transistors M are connected. First booster 62 produces an output voltage which is supplied as a high-level voltage to selection gate control line SG1. Second voltage booster 64 produces an output voltage having an increased voltage potential which is to be supplied to a corresponding word line WLi and is controlled in response to an output voltage of first voltage boost circuit 62, as will be explained in detail hereinafter.

Figure 5:
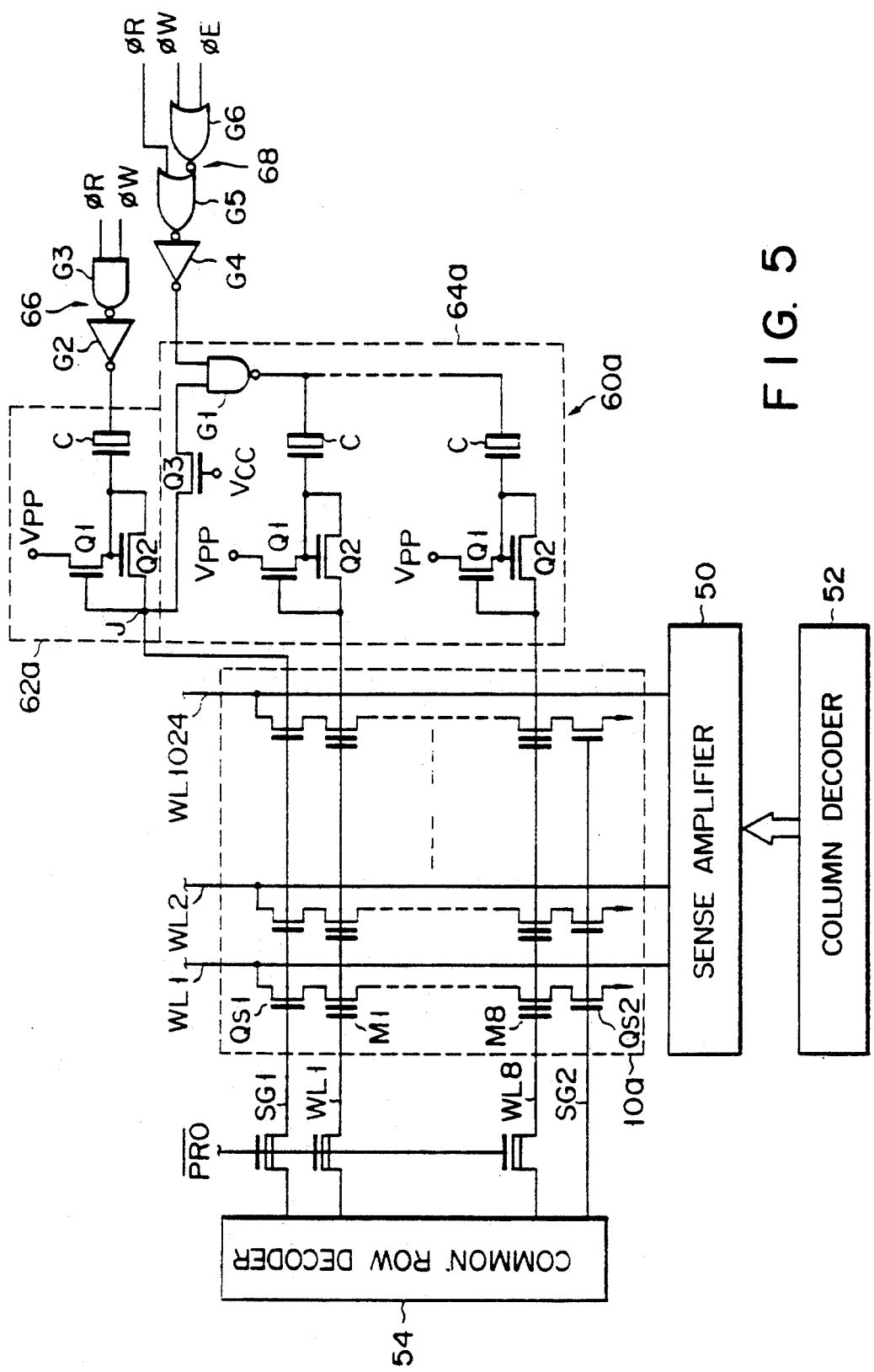
FIG. 5 is a diagram showing a detailed internal circuit configuration of peripheral circuit section provided for one of "cell block" sections associated therewith.

As shown in FIG. 5, first voltage booster 62a is constituted essentially by a charge-pump circuit, which consists of a capacitor C1 and two FETs Q1 and Q2. FET Q1 has a source connected to a voltage Vpp, a drain connected to capacitor C, and a gate connected to a selection gate control line SG1. FET Q2 has a source connected to the gate of FET Q1; its gate and drain are connected in common to the drain of FET Q1. Second voltage booster 64a also includes eight sets of charge-pump circuits, each of which has the same configuration as that of first booster 62a: same reference symbols are used to designate same components, and detailed description therefor will be omitted. These charge-pump circuits are connected to word lines WL1 to WL8, respectively.

It is important that common node J between gate of FET Q1 and source of FET Q2 in first voltage boost circuit 62a, e.g., selection gate control line SG1 to which first selection transistor Qs1 is connected at the gate thereof, is connected via FET Q3 and NAND gate circuit G1 to capacitors C of charge-pump circuits provided in second voltage boost circuit 64a. Node J is connected via FET Q3 to a first input of NAND gate G1, which has an output connected to capacitor C of every charge-pump circuit provided in second voltage booster 64a. FET Q3 is supplied at its gate with d.c. powersupply voltage Vcc of this EEPROM. With such circuit arrangement, second voltage booster 64a associated with word lines WL1 to WL8 may operate in response to first voltage booster 62a which is associated with selection gate control line SG1.

To be more specific, as indicated in FIG. 5, for instance, clock gate circuit 66 constituted by inverting gate (inverter) G2 and NAND gate G3 is connected to capacitor C in first voltage boost circuit 62a. Clock gate circuit 66 is supplied with write control signal $\phi W$ at the first input of NAND gate G3 contained therein; it is supplied at the second input of NAND gate G3 with repeated clock signal $\phi R$ which is supplied by a well-known ring oscillator that is not shown in this drawing. When write control signal $\phi W$ has the "H" level, clock gate circuit 66 permits clock signal $\phi R$ to be transmitted to first voltage boost circuit 62a.

On the other hand, second voltage boost circuit 64a is provided at its pre-stage with clock gate circuit 68, which consists of inverter G4, NOR gate G5, and NOR gate G6, for example. NOR gate G5 receives repeated clock signal $\phi R$ at its first input. NOR gate G5 receives at its second input an output signal of NOR gate G6, which is supplied at its first input with a write control signal $\phi R$, and an erase control signal $\phi E$ at its second input. When either one of write control signal $\phi W$ and erase control signal $\phi E$ has the "H" level, clock gate circuit 68 then permits clock signal $\phi R$ to be transmitted to second voltage boost circuit 64a. The output of inverter G4 is connected to the second input of NAND gate G1.

With such an arrangement, NAND gate G1 functions to supply clock signal $\phi R$ to charge-pump circuits of second voltage boost circuit 64a only when first voltage boost circuit 62a generates the output voltage signal of "H" level, which will be transmitted to gate control line SG1 thereby to render selection transistor Qs1 conductive. In other words, the output signal of gate circuit 68 associated with second voltage boost circuit 64a is input as a control signal to NAND gate G1 through FET Q3 only when the output signal of first voltage boost circuit 62a changes to have the "H" level; thereafter, it is transmitted to parallel-connected charge-pump circuits of second voltage boost circuit 62a associated with word lines WL1 to WL8.

The operation modes of the EEPROM will now be described with reference to the timing chart of FIGS. 6 and 7. In this drawing, a voltage on bit lines BL is represented by "Vbit"; voltages appearing at terminals SD1 and SS1 are represented by "Vsg1" and "Vsg2", respectively; voltages to be applied on word lines WL via terminal CG1, CG2, CG3, ..., CG8 are represented by "Vcg1", "Vcg2", "Vcg3," ..., "Vcg8", respectively.

The EEPROM performs data erasing for all the memory cells in memory cell block section 10a in the manner to be described below. When the EEPROM is set in a data erase mode, common row decoder circuit 54 first generates high-level ("H" level) voltages of 5 volts, for example, at time t1 as shown in FIG. 6. The "H" level voltages are applied to selection gate control line SG1 and all the word lines WL1 to WL8 of memory cell block section 10a. At this time, the corresponding selection gate control line SG1' of the neighboring memory cell block section 10b is applied with low-level ("L" level) voltage, 0 volts, for example, as shown in FIG. 6.

In memory cell block section 10a being presently selected, applying "H" level voltage to selection gate control line SG1 causes FET Q1 of first voltage booster 62a to be rendered conductive. As a result, the output clock signal φR of the ring-oscillator (not shown in FIG. 5) which is being supplied to gate circuit 66 and has a rectangular-shaped waveform of typically an amplitude of 5 volts, for example, is transmitted by gate circuit 66 to first voltage booster 62a associated with memory cell block section 10a. The charge-pumping operation is then carried out in first voltage booster 62a, thereby to produce at time t2 a boosted voltage Vpp of a certain voltage potential increased to have the same potential as voltage Vpp, 17 volts, for example, as shown in FIG. 6. The boosted voltage Vpp (=17 volts) is applied to selection gate control line SG1. First selection transistor QS1 is thus rendered conductive, so that NAND cell units U1 to U1024 included therein are connected to the corresponding bit lines BL1 to BL8, respectively.

As the boosted voltage Vpp is applied to line SG1, node J is also applied with voltage Vpp, which is accordingly supplied to NAND gate G1 via FET Q3 provided in second voltage booster 63. NAND gate G1 receives at the first input a voltage the potential of which is represented by "Vcc−Vth," where "Vth" denotes a threshold voltage of FET Q3: the input voltage of NAND gate G1 is typically 4 volts. NAND gate G1 permits the output signal φR of ring-oscillator (not shown) supplied thereto via gate circuit 68 to be transmitted to second voltage booster 64a. Accordingly, in response to supplying boosted voltage Vpp to selection gate control line SG1, charge-pump circuits of second circuit 64a are supplied with clock signal φR, whereby the charge-pumping gets started so that the voltage potentials on word lines WL1 to WL8 are simultaneously increased up to voltage Vpp, e.g., 17 volts. As a result, since the voltage Vsg1 on selection gate control line SG1 and voltages Vcg1 to Vcg8 on word lines WL1 to WL8, e.g., gate control lines for memory cell transistors M, are 17 volts in the voltage potential thereof, as shown in FIG. 7, all the memory cell transistors M constituting memory cell units U in cell block section 10a are subjected to a simultaneous data erasure.

While memory cell block 10a is being subjected to the data erasing, the selection gate control line SG1' of the neighboring memory cell block 10b is maintained at the "L" level voltage. First voltage boost circuit 62b, which is associated with cell block 10b as shown in FIG. 1, is prevented from execute its charge-pumping operation, since an FET corresponding to FET Q1 of first voltage boost circuit 62a associated with memory cell block section 10a has a gate voltage being maintained at the "L" level, and thus being rendered nonconductive. Second voltage boost circuit 64b is therefore prevented from being activated; the voltages on the control gate terminals CG1' to CG8', which are connected to the word lines of memory cell block 10b, are prevented from increasing from 5 volts to 17 volts, so that data erasure does not occur with respect to the memory cell units of the neighboring memory cell block section 10b.

Thereafter, when the EEPROM is set in a data write mode, data may be sequentially written into a desired memory cell unit Ui selected from among those of memory cell block section 10a in a reverse order that the memory cell transistors M1 to M8 are positioned: the memory cell transistor M8 which is positioned most far from a node between the selected cell unit Ui and the corresponding bit line BLi associated therewith; and the memory cell transistor M1 that is positioned most near to the above node is last subjected to the data writing. In the data write mode, voltage Vpp is changed in its potential from 17 volts to 22 volts, for example.

Figure 7:
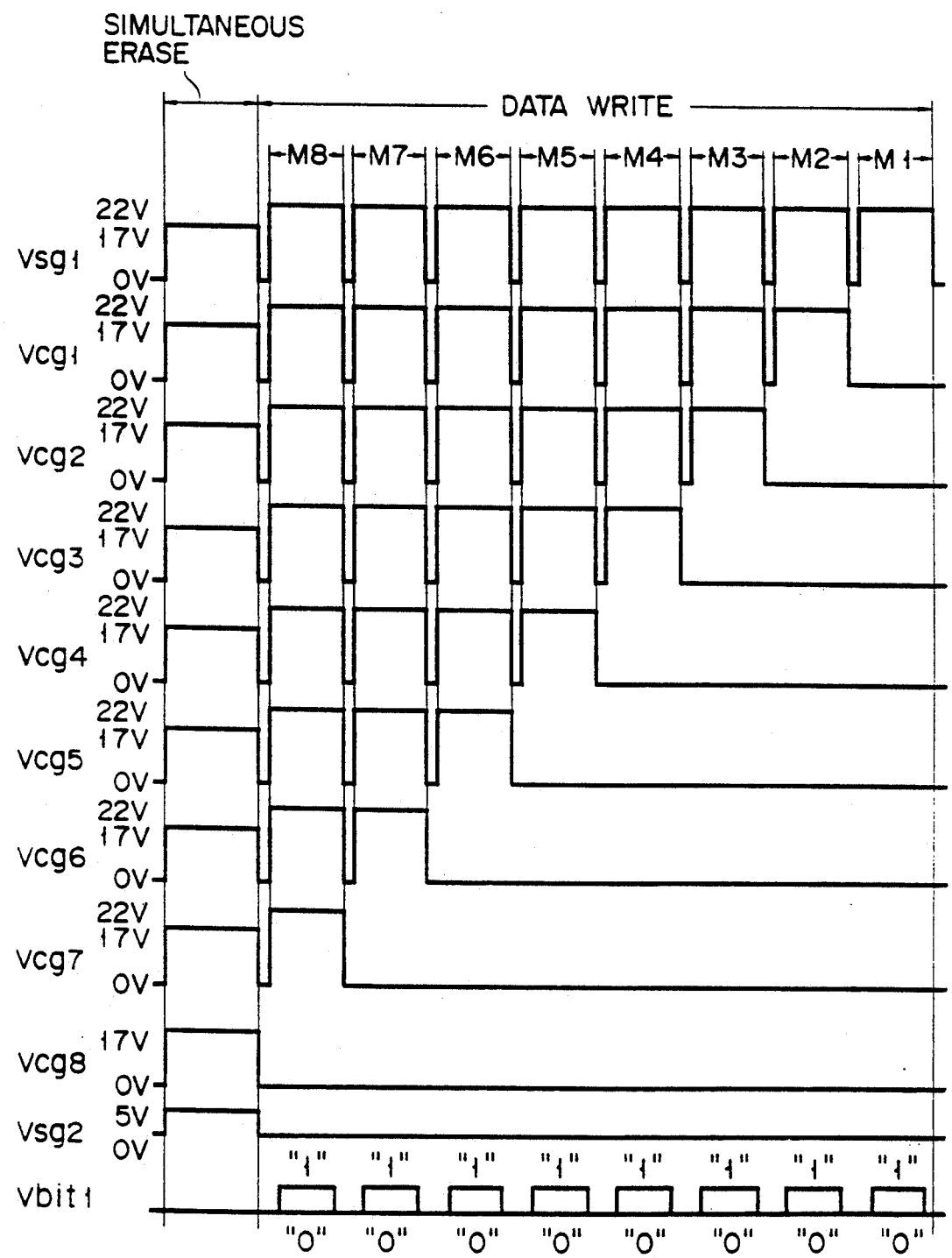
FIG. 7 is a diagram showing the overall waveforms of main electrical signals which are generated at main parts of the EEPROM in FIG. 1 in a data erase mode and a data write modes thereof.

As shown in FIG. 7, when a cell unit U1 is selected in block 10a, memory cell transistors M contained therein are sequentially subjected to data writing in a reverse order that they are positioned. In order to write data into memory cell transistor M8 first in cell unit U1, common row decoder 54 generates "H" level voltage (=5 volts), which are supplied to selection gate control line SG1 and word lines WL1 to WL7 via FETs T9, T1, ..., T7 (not visible in FIG. 1) which are rendered conductive in response to control signal PRO supplied by line CL. Decoder 54 also generates an "L" level voltage, which is supplied to second selection transistor Qs2 via selection gate control line SG2 directly connected to decoder 54. At this time, decoder 54 supplies "L" level voltages to first and second selection gate control lines SG1' and SG2' associated with the neighboring cell block 10b.

Only the first boost circuit 62a, which is connected with memory cell block 10a containing the selected cell unit U1, is activated to execute a charge-pumping operation which is essentially same as that in the data read mode described above. Charge-pumping causes boosted voltage Vpp (=22 volts) to be supplied to first selection gate control line SG1, whereby the first selection transistors including transistor Qs1 for the selected cell unit U1 are rendered conductive, so that cell unit U1 is connected to the corresponding bit line BL1 associated therewith.

In response to the output voltage Vpp (=22 volts) of first booster 62a, the charge-pump operation gets started in second booster 64a, with the result of boosted voltage Vpp (=22 volts) being also supplied to word lines WL1 to WL7, which are connected with nonselected memory transistors M1 to M7 positioned between first selection transistor Qs1 and the selected memory cell transistor M8. These memory cell transistors M1 to M7 are thus rendered conductive. Under such a condition, when a data voltage having either the logical "1" level or "0" level is applied to bit line BL1 in a known manner, the data voltage is transmitted to the selected memory cell transistor M8 via selection transistor Qs1 and memory cell transistors M1 to M7, and then written into the selected memory cell transistor M8.

It should be noted, under such condition, that the corresponding cell unit U1' which is connected to the same bit line BL1 in the neighboring cell block 10b is prevented from being subjected to data writing, because first voltage booster 62b for the neighboring cell block 10b, as well as the remaining voltage boosters associated with the remaining cell blocks not visible in FIG. 1, is prevented from being activated, so that the second voltage booster 64b associated with word lines of block section 10b is kept inoperative. This means that any unintentional data write can be eliminated in the nonselected memory cell blocks 10b, ..., although the word lines thereof are connected together in common with the word lines WL1 to WL7 of the selected memory cell block 10a.

Subsequently, memory cell transistor M7 adjacent to the transistor M8 which has been completed in data writing is selected and then subjected to data writing in accordance with the predetermined data writing order. At this stage of the data write mode, common row decoder 54 changes the voltage potential to be supplied to word line WL7 from the "H" level to the "L" level voltage; while the other word lines WL1 to WL6 are being maintained at the same voltage, e.g., the "H" level voltage, and the word line WL1 is being maintained at the same voltage, e.g., the "L" level voltage, as clearly shown in FIG. 7. As a result, data to be written into memory cell transistor M7, logical "1" or "0", is transmitted to the aimed transistor M7 through cell transistors M1 to M6 located between the selection transistor Qs1 and the cell transistor M7 being presently selected in cell unit U1. The data can thus be written into the selected cell transistor M7.

The remaining memory cell transistors M6, M5, ..., M1 may be sequentially subjected to data writing in this order in a similar manner as explained above. For example, cell transistor M6 can be subjected to data writing by applying word lines WL1 to WL5 with the "H" level voltage, applying word lines WL7 and WL8 with the "L" level voltage. Similarly, when data is written into a next cell transistor M5, the word lines WL1 to WL4 are applied with the "H" level voltage, while the word lines WL5 to WL8 are supplied with the "L" level voltage. The data write operation in cell unit U1 will be completed when cell transistor M1 is given with data voltage to be written thereinto by applying the "L" level voltage to all the word lines WL1 to WL8. At this time, data voltage on bit line BL1 is transmitted to cell transistor M1 via selection transistor Qs1.

During the data write mode, after the boosted voltage Vpp is produced by second voltage boost circuit 64a, and when it is being applied to word line(s) connected to selected memory cell transistor(s) M, it can be prevented by D type switching transistors T, which are provided between memory cell block 10a and the common row decoder 54, that the increased voltage is applied unintentionally to common row decoder 54, thereby damaging the same. It can also be prevented by these D type transistors T that the increased voltage is applied undesirably to the corresponding word lines connected in common to row decoder 54, which may degrade the operation reliability of the EEPROM.

According to the EEPROM arranged as described above, row decoder circuit 54 is provided connected in common to a number of memory cell blocks 10a, 10b, ..., which are associated with the same set of bit lines BL1, BL2, ..., BL1024. It is thus possible to greatly simplify the circuit configuration of the peripheral circuit for memory cell block sections 10a, 10b, and so on. The simplification of the actual circuit arrangement of peripheral circuit section can improve the ratio of occupied area of the memory section and the drive-control circuit section therefor on the chip substrate having a limited area. As a result, it can be expected that if the chip size is constant, the memory capacity can be increased; conversely, if the memory capacity is constant, the necessary chip area can be decreased. In any event, the integration density of EEPROM can be successfully improved.

In addition, according to the embodiment, the peripheral circuit section, which is provided for each memory cell block section 10a, 10b to generate the boosted voltage Vpp, includes first voltage generation section 62 for selection gate control line SG1, and second voltage generation section 64 for word lines WL: the latter detects that the boosted voltage is output by first voltage generation section 62 and become operative automatically in response to the detection result. Such an arrangement can eliminate unintentional data programming in a data write mode of the EEPROM. In other words, during a sequential data writing operation is being executed in a certain memory cell unit Ui which is included in a specific memory cell block section 10a, for example, selected from among memory cell block sections 10 associated with a set of bit lines BL, erroneous data writing can be completely prevented from being performed with respect to the corresponding word lines also connected to common row decoder 54 in the remaining, non-selected memory cell block sections 10b, ... which are associated with the same set of bit lines BL1 to BL1024. The reason is as follows. Even when the boosted voltage Vpp is generated by first voltage generation section 62a onto selection gate control line SG1 for the aim of data writing in the selected cell block section 10a, it will never happen that selection gate control line SG1' is supplied by common row decoder 54 with the boosted voltage Vpp in each of the non-selected memory cell block sections 10b, ...; accordingly, first voltage generation section 62b is kept inoperative with the result of second voltage generation section 64b being prevented from being activated.

The aforementioned arrangement for the peripheral voltage boost circuit section may also contribute to being able to eliminate the need of providing a circuit which controls independently second voltage generation sections 64a, 64b,... for word lines WL; this will lead to simplification of the peripheral circuit section in EEPROM. The combination of the above-mentioned technical features makes it possible to provide highly integrated EEPROMs with enhanced operational reliability and, in particular, improved data programming performance.

What is claimed is:

1. A non-volatile semiconductor device comprising:
a substrate;
data transmission lines arranged on said substrate;
a memory cell section connected to said data transmission lines, said memory cell section including a plurality of memory cell units each of which has a series-circuit of data storage transistors and a switching transistor, each of said data storage transistors having a charge storage layer and a control gate;
decoder means connected to said memory cell section, for generating a first voltage which represents a "high" potential level; and
voltage controller means connected to said data storage transistors, for generating a second voltage in response to the first voltage, said second voltage having a voltage potential high enough to render the data storage transistors conductive.

2. The device according to claim 1, wherein said voltage controller means comprises means for applying a third voltage to the switching transistor, which is then rendered conductive, in response to the first voltage.

3. The device according to claim 1, further comprising:
a further memory cell section connected to said data transmission lines and including a plurality of memory cell units each of which has a series-circuit of data storage transistors and a switching transistor, each of said data storage transistors having a charge storage layer and a control gate; and
said decoder means being connected in common to the memory cell sections.

4. The device according to claim 3, wherein said voltage controller means is also connected to said switching transistor and comprises:
first voltage generator means connected to the switching transistor, for detecting that the first voltage is supplied to said switching transistor, and for generating a third voltage which is supplied to said switching transistor to render the switching transistor conductive in response to detecting that the first voltage is supplied to said switching transistor; and
second voltage generator means connected to the data storage transistors at the control gates thereof and to said first voltage generator means, for applying to said switching transistors the second voltage in response to the third voltage of said first voltage generator means.

5. The device according to claim 4, wherein said data storage transistors comprise floating gate tunneling metal insulator semiconductor field effect transistors.

6. An erasable and programmable read-only memory comprising:
a semiconductor substrate;
bit lines and word lines arranged on said substrate to insulatively intersect each other thereby defining cross points therebetween;
memory cell transistors provided at the cross points, said memory cell transistors being grouped into a plurality of memory subsections each of which comprises cell units each of which has a number of series-connected memory cell transistors, said memory cell transistors having control gates and data storage layers;
switch means for selectively connecting said cell units to the corresponding bit lines;
row decoder means connected to said word lines and said switch means, for selectively designating one or some of said word lines as selected word lines by generating an "H" level voltage supplied thereto; and
voltage control means associated with said memory cell transistors, for generating a voltage which is potentially greater than the "H" level voltage and which renders the transistors conductive, and for supplying said voltage to the selected word lines.

7. The memory according to claim 6, wherein said voltage control means comprises:
voltage increment means for causing the "H" level voltage to be increased up to said voltage which renders the transistors conductive.

8. The memory according to claim 6, wherein said voltage control means comprises:
first driver means for electrically driving said switch means to cause said switch means to turn on; and
second driver means coupled to said first driver means, for electrically activating said word selected lines to cause carriers to tunnel between the data storage layers and said substrate in the memory cell transistors connected to said selected word lines.

9. The memory according to claim 8, wherein said first driver means uses said voltage to turn on said switch means.

10. The memory according to claim 8, wherein said second driver means uses said voltage to cause carriers to tunnel between the data storage layers and said substrate in the memory cell transistors connected to said selected lines.

11. The memory according to claim 8, wherein said switch means comprises insulated gate field effect transistors associated with said cell units respectively.

* * * * *